(12) United States Patent
Crotty et al.

(10) Patent No.: US 7,315,305 B2
(45) Date of Patent: Jan. 1, 2008

(54) METHOD FOR VISUALIZING DATA

(75) Inventors: Cassondra L. Crotty, Avon, CT (US); Daria R. Dooling, Huntington, VT (US); David E. Moran, South Burlington, VT (US); Ralph J. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 1058 days.

(21) Appl. No.: 09/224,696

(22) Filed: Jan. 4, 1999

(65) Prior Publication Data

US 2002/0050995 A1    May 2, 2002

(51) Int. Cl.
*G06T 11/20* (2006.01)
*G09G 5/00* (2006.01)

(52) U.S. Cl. .......................... 345/440; 345/619
(58) Field of Classification Search ................ 345/440
See application file for complete search history.

(56) References Cited

U.S. PATENT DOCUMENTS

| | | | |
|---|---|---|---|
| 5,164,911 A * | 11/1992 | Juran et al. | ............ 345/418 |
| 5,285,193 A * | 2/1994 | Iwasaki | .................. 345/440 |
| 5,581,677 A | 12/1996 | Myers et al. | |
| 5,590,271 A | 12/1996 | Klinker | |
| 5,625,767 A | 4/1997 | Bartell et al. | |
| 5,636,350 A * | 6/1997 | Eick et al. | .................. 345/440 |
| 5,704,028 A * | 12/1997 | Schanel et al. | ............. 345/440 |
| 6,222,540 B1 * | 4/2001 | Sacerdoti | .................... 345/440 |
| 6,222,547 B1 * | 4/2001 | Schwuttke et al. | ......... 345/440 |
| 6,232,984 B1 * | 5/2001 | Chuah et al. | ............... 345/440 |

OTHER PUBLICATIONS

Yousef Saad, Iterative Methods for Sparse Linearsystems, PWS Publishing Company, 1996, pp. 144-204.
Kendall E. Atkinson, An Introduction to Numerical Analysis, Second Edition, Wiley, 1989, pp. 507-571.

* cited by examiner

*Primary Examiner*—Kee M Tung
*Assistant Examiner*—Chante Harrison
(74) *Attorney, Agent, or Firm*—RatnerPrestia

(57) ABSTRACT

A system and method for visualizing data. Data are provided either in the form of data values of a data array or in the form of a geometric representation. A data array may be, for example, a sparse matrix. A geometric representation, may be, for example, an integrated circuit layout coded in a geometric description language. Data provided in the form of data values are associated with geometric shapes placed on a grid. Information placed on the grid is then reported to a user. If data are provided in the form of a geometric representation, then data values are extracted from the geometric representation. A graphic representation is generated from the extracted data values. The graphic representation is exhibited to a user.

12 Claims, 9 Drawing Sheets

$$\begin{bmatrix} 1 & -1 & -1 \\ -1 & 1 & -1 \\ -1 & -1 & 1 \end{bmatrix} = $$

FIG. 4

METHOD FOR VISUALIZING DATA

TECHNICAL FIELD

The present invention relates generally to graphical computer systems and, more specifically, to a method and system for visualizing data.

BACKGROUND OF THE INVENTION

Scientific visualization involves displaying large sets of data generated in the process of investigating a scientific or engineering problem. In many engineering applications, large linear systems of equations arise. Such applications include, for example, simulation of nonlinear microwave circuits, robotic control, or power systems design. Linear systems of equations are typically expressed in the form $$Ax=b, \quad (1)$$

where $A \epsilon R^{n \times n}$ or $A \epsilon C^{n \times n}$, i.e., A is a square n-dimensional matrix with real or complex elements, $x \epsilon R^{n \times 1}$ and $b \epsilon R^{n \times 1}$, or $x \epsilon C^{n \times 1}$ and $b \epsilon C^{n \times 1}$, i.e., x and b are either real or complex n-dimensional vectors. The entries of the matrix A are values that arise from the physical system involved. For example, the matrix A is often a Jacobian matrix related to a nonlinear algebraic equation associated with a physical system, e.g., a conductance matrix of an electronic circuit, where x is a voltage vector and b is a current vector.

A matrices characterize both numerical and structural properties of the physical system. Numerical or quantitative properties are indicated by the elements of A being, for example, "real," "complex," "positive," "negative," "integer," or "floating point" to name just a few. Structural or qualitative properties are related to the position or indexing of the elements of the matrix. The position of an element in a matrix is indexed by integers indicating the row and column position of the element. Note that matrices are 2-dimensional arrays and some physical systems may involve higher dimensional arrays such as 3-dimensional arrays. In the case of a 3-dimensional array, for example, the position of elements in the array are indexed by a row, a column, and a plane. Characterization of structural properties of a matrix include, for example: dense matrices, in which many of the elements of the matrix are non-zero; sparse matrices, in which many of the elements of the matrix are zero; Hermitian or symmetric matrices, in which a matrix equals its adjoint; and skew-symmetric matrices, in which the elements of the transpose of the matrix have the opposite sign from the elements of the matrix.

Many numerical methods exist for the solution of systems of equations expressed in the form of equation (1); see, for example, Kendall E. Atkinson, "An Introduction to Numerical Analysis," (Wiley, 1989), and Yousef Saad, "Iterative Methods for Sparse Linear Systems," (PWS Publishing Company, 1996). Numerical methods for the solution of these systems of equations include reordering, preconditioning, factoring, and substitution. The choice of numerical method for the solution of equation (1) is guided by the numerical and structural characteristics of the physical systems modeled.

There are conventional software packages that allow a user to store and display data arrays, such as matrices. For example, commercial software packages such as MATLAB® by the Math Works Inc. or MATHEMATICA® by Wolfram Research. These software packages, however, may not be able to display a conductance matrix associated with the operation of an electrical circuit with millions of components. The main difficulty with conventional packages is the limitation placed on allocation of memory provided for the storage of data arrays, thus limiting the ability of conventional packages to display large arrays. The deficiencies of the conventional software packages show that a need still exists for a method and system which permit visualization of large sets of data.

SUMMARY OF THE INVENTION

The difficulty of choosing an appropriate and efficient numerical method for the solution of the engineering problem may be overcome by graphical visualization of the data. In particular, it may be insightful to graphically view a matrix such as the A matrix of equation (1). For example, a microprocessor integrated circuit (IC) may use four signal types: power signals, clock (timing) signals, control signals, and data signals. Each signal type is described by a reactive network having one or more resistive, capacitive, and inductive components. Such a network may contain 1-10 million components for each signal type. Each such network is described by an equation of the form Ax=b. In particular, the direct current (dc) solution of a microprocessor (IC) power signal network may be represented by an equation Ax=b, with A symmetric and positive definite. In the case for which A is symmetric and positive definite, Cholesky factorization and backward substitution may be applied to solve the equation Ax=b.

To meet this and other needs, and in view of its purposes, the present invention provides a method and system for visualizing data arrays represented in the form of a plurality of data values. A grid is generated based on the plurality of data values. Each data value is associated with a geometric shape. The geometric shapes associated with the data values are placed on the grid. The visual and geometric information placed on the grid are reported to a user in graphical form.

In addition, it is possible to identify one of a plurality of numerical attributes associated with each data value of the plurality of data values, and associate with each numerical attribute one of a plurality of visual attributes. Then, each data value is associated with a geometric shape having one of the plurality of visual attributes. The geometric shapes associated with each data value of the plurality of data values are placed on the grid. The visual and geometric information placed on the grid are reported to a user in graphical form.

Alternatively, the present invention provides a method and system for visualizing data provided in the form of a geometric representation. A plurality of data values are extracted from the geometric representation. A graphic representation of the plurality of data values is generated. The graphic representation is displayed to a user.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. Included in the drawing are the following figures.

Figure 4:
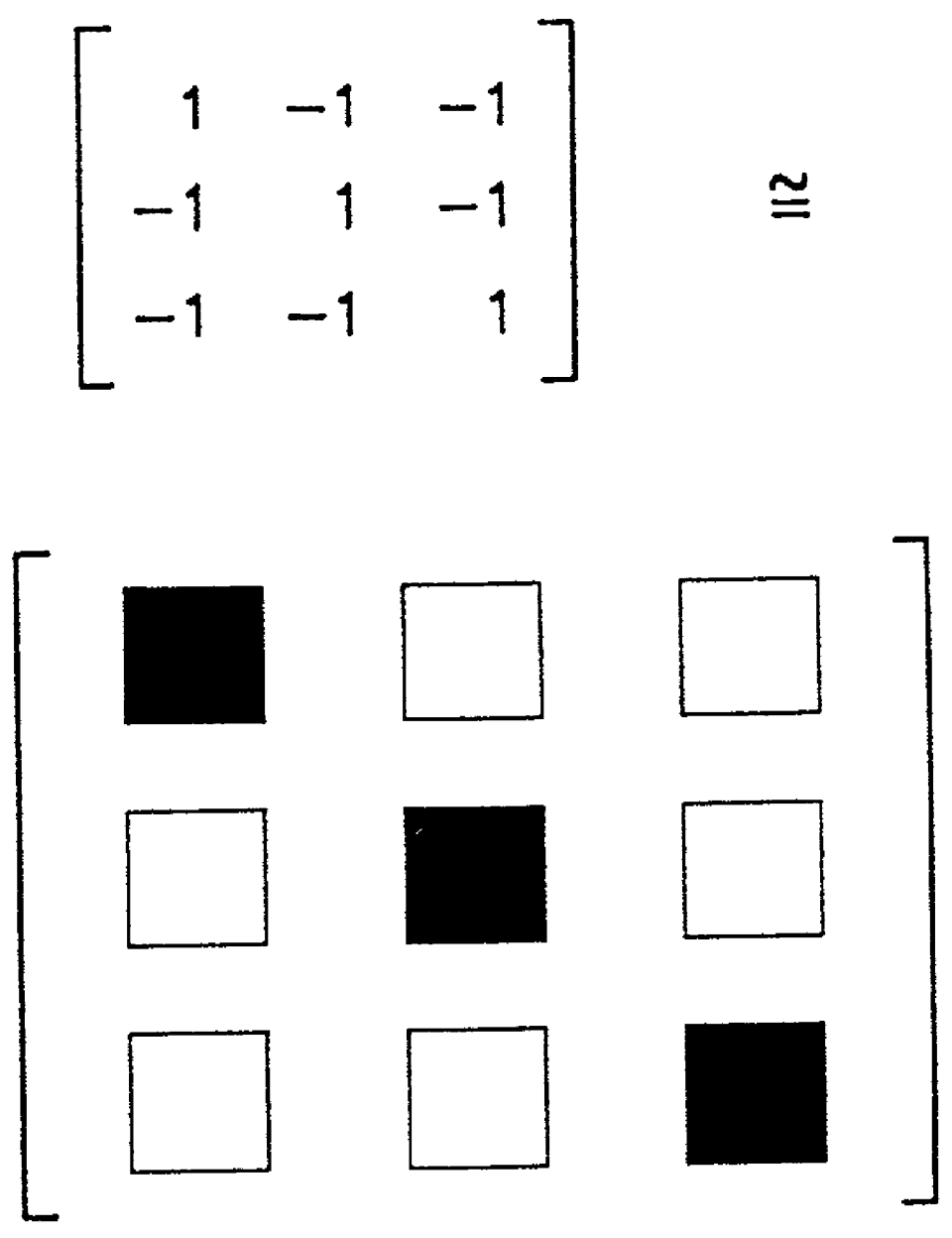

FIG. 4 is an exemplary graphical representation of a simple dense array that is helpful in understanding an embodiment of the present invention;

DETAILED DESCRIPTION OF THE INVENTION

In integrated circuit physical design systems, for example, special shapes associated with the integrated physical circuit layout are described by a syntax of a language such as, for example, Graphics Language 1 (GL1) or Graphic Design Language (GDS). These languages provide mechanisms to describe three-dimensional space, orientation, and parametric information such as power service terminal (PST), logic service terminal, and IC package to IC interconnections. The shapes described by languages such as GL1, GDS, or the like are placed on a grid that represents the physical area of an integrated circuit (a chip). The geometric description language may then be used to build a set of photolithographic masks. Each mask represents a different step in the manufacture of an integrated circuit. Different geometric characteristics of the lithographic masks represent transistors, wires, insulation, or the like, of the integrated circuit. The integrated circuit may be manufactured on a silicon substrate with insulated interconnects (wires). The geometric shapes involved in an integrated circuit are typically on a microscopic scale. Such a manufacturing process is a planar, or layered, process in which transistors may occupy the lower levels and the interconnects and insulation occupy the remaining higher levels.

A physical design system such as, for example, the Cadence™ system may graphically display or print out information, such as a grid including geometric shapes, coded in a geometric description language such as GL1. Physical design software systems typically have large memory capacity to accommodate the shapes involved in the design of an integrated circuit. A physical design system may accommodate designs having millions of shapes, such as the shapes involved in an integrated circuit which are typically on a microscopic scale. Hence, a physical design system may graphically illustrate data arrays with millions of data variables.

Figure 1:
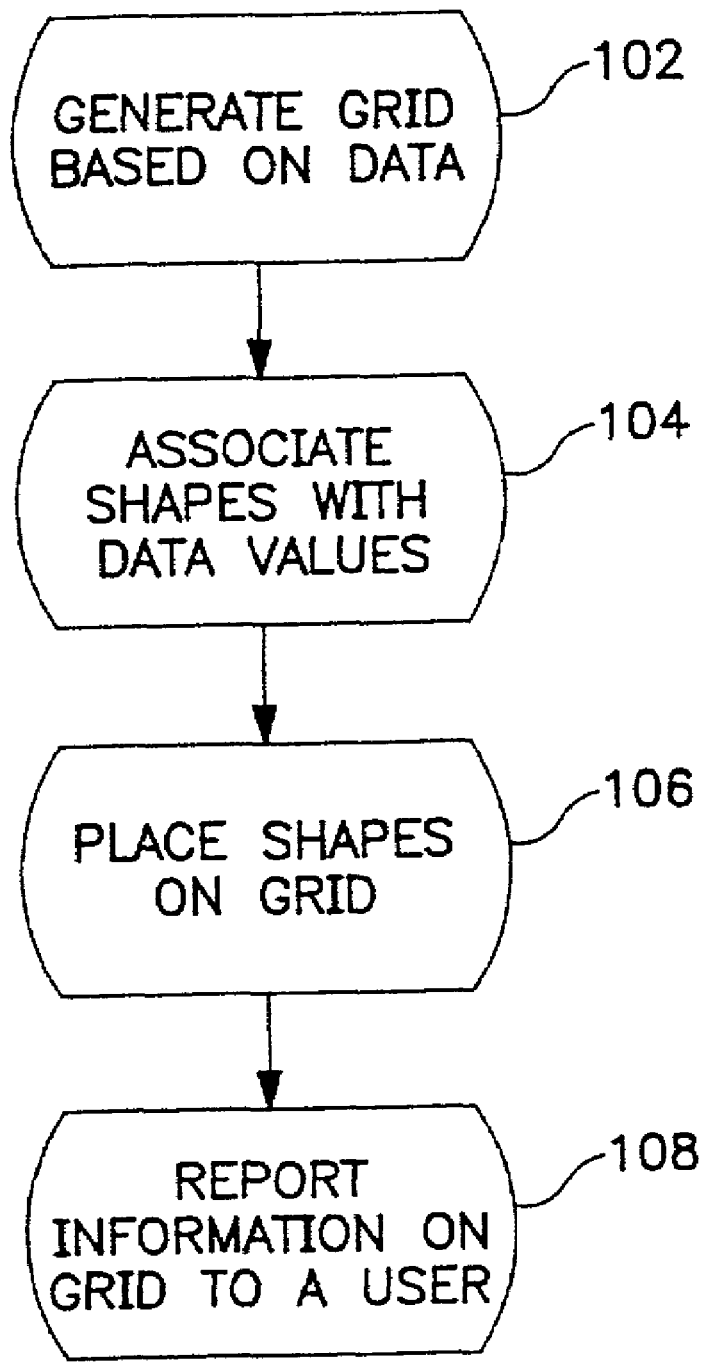
FIG. 1 is a flow chart illustrating steps in a method for visualizing data arrays in accordance with an embodiment of the present invention.

FIG. 1 is a flow chart illustrating steps in a method for visualizing data arrays in accordance with an embodiment of the present invention. In step 102, a multi-dimensional grid is generated. The position of data values in an array, for example, the rows, columns, and planes, may be used to generate the grid. In other words, the grid may be treated as a template for a numerical array, or the grid may act as a reference in a similar manner to a coordinate system. The grid may subsequently be used as a reference for the placement of geometric shapes.

In step 104, arbitrary geometric shapes are associated with the data values in the array. That is, each entry or data value is identified with a geometric shape such as, for example, a line, a circle, a rectangle, a triangle, or a dodecahedron. Numerical properties of the data values such as, for example, magnitude and sign as well as the type of data values, for example, real or complex may be used to determine the choice of geometric shape. Numerical properties may be used to determine the sort of geometric shape identified with a data value as well as the relative size and appearance of the shape. For example, a positive, real number may be represented by a solid square; a negative, real number may be represented by an open square. Thus, a graphical representation of the dense array $$\begin{bmatrix} 1 & -1 & -1 \\ -1 & 1 & -1 \\ -1 & -1 & 1 \end{bmatrix}$$

may be constructed as illustrated in FIG. 4.

For example, consider a system that uses graphics capabilities, such as an integrated circuit physical design system. In such a physical design system, geometric shapes may be used to represent circuit components including transistors, interconnects (wires), and insulation. Such circuit components are represented by data values detailing various technical specifications of the components. For example, the dimensions of a transistor length or width may be specified in micrometers (e.g., $0.6 \times 10^{-6}$ meters) and the electrical resistance of a conductor may be specified in ohms (e.g., $1.5 \times 10^{-3} \Omega$).

In step 106, the geometric shapes associated with the data values are placed on the grid. The grid may be multi-dimensional so as to correspond to a multi-dimensional array. The positioning of a geometric shape on the grid is related to the index of a data value entry of the array.

In step 108, the information contained in the grid, including the geometric shapes, is reported to a user. It is preferable to report the information to a user on a computer display or in the form of a printout.

The present invention may take advantage of the capability of a physical design software system to graphically display numerical data arrays. As detailed in the steps shown in FIG. 1, numerical and structural properties of data arrays may be represented in a form that is recognized by a physical design system. The data array displayed, for example, in a printout makes it possible to visualize properties of a data array.

If a data array is sparse, for example, then by visualizing the data array it may be possible to observe certain patterns. Sparsity patterns may lead to the choosing of suitable numerical methods, or reordering schemes with which to treat the data array. Sparsity patterns may also provide insight into the possibility of parallel processing of the data array. An integrated circuit visualization of the array may be used to determine circuit properties such as, for example, points of high current or points of low voltage. If the data values in the data array represent numerical data that is part of a larger computational process, then visualizing the data array may help to detect computationally intensive portions of the process.

Figure 2:
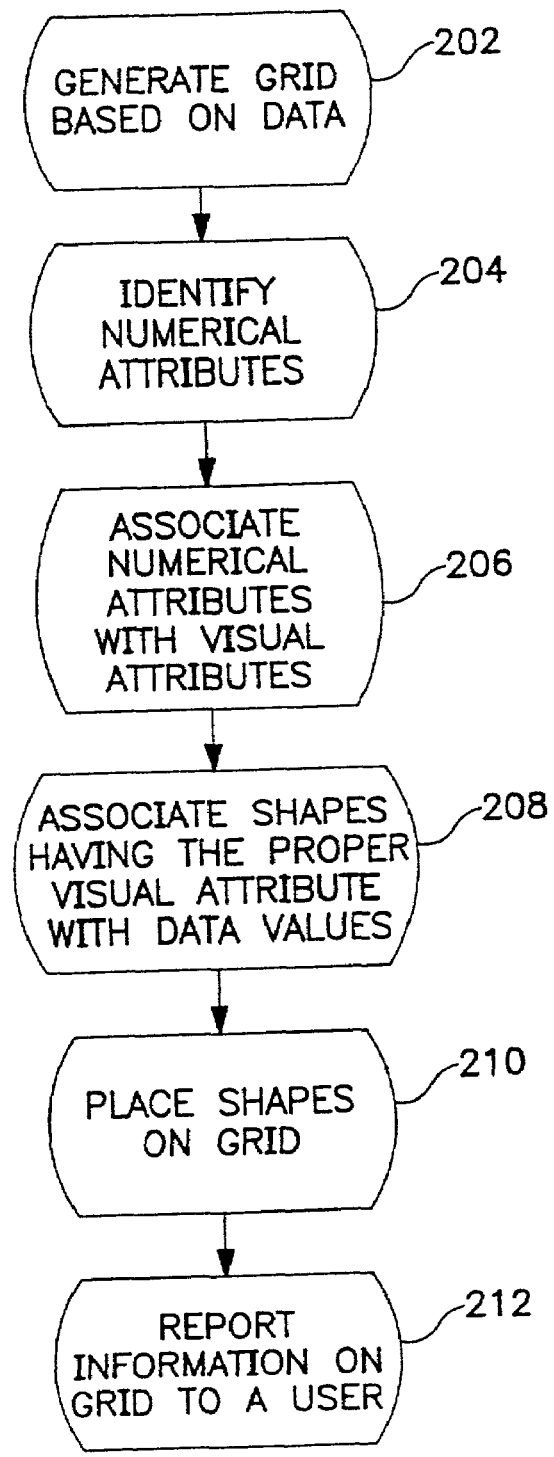
FIG. 2 is a flow chart illustrating steps in a method for visualizing data arrays in accordance with an embodiment of the present invention.

FIG. 2 is a flow chart illustrating steps in a method for visualizing data arrays in accordance with an embodiment of the present invention. In the same way as in step 102 of FIG.

1, a grid is generated in step 202. In step 204, numerical attributes associated with data values of the data array are identified. Numerical attributes associated with data values may include the sign of a data value and the range of magnitude of a data value. In step 206, visual attributes are associated with numerical attributes identified in step 204. Visual attributes may include, for example, color, hue, brightness, and saturation. Visual attributes may be used to highlight numerical properties of the data values of the data array. For example, the range and distribution of the numerical magnitude of data values may be highlighted by a variety of colors and changes in brightness.

In step 208, geometric shapes having the proper visual attributes are associated with the data values in the array. In other words, each data value, having a numerical attribute, is associated with a geometric shape, having a visual attribute, through the association performed in step 206. For example, a geometric shape associated with a data value with a magnitude belonging to a particular range of magnitudes has the color associated with that range of magnitudes.

In step 210, similarly to step 106 of FIG. 1, the geometric shapes associated with the data values are placed on the grid. In step 212, which is the same as step 108 of FIG. 1, the information contained in the grid including the geometric shapes is reported to a user. It is preferable to report the information to a user on a computer display or in the form of a printout.

Figure 3:
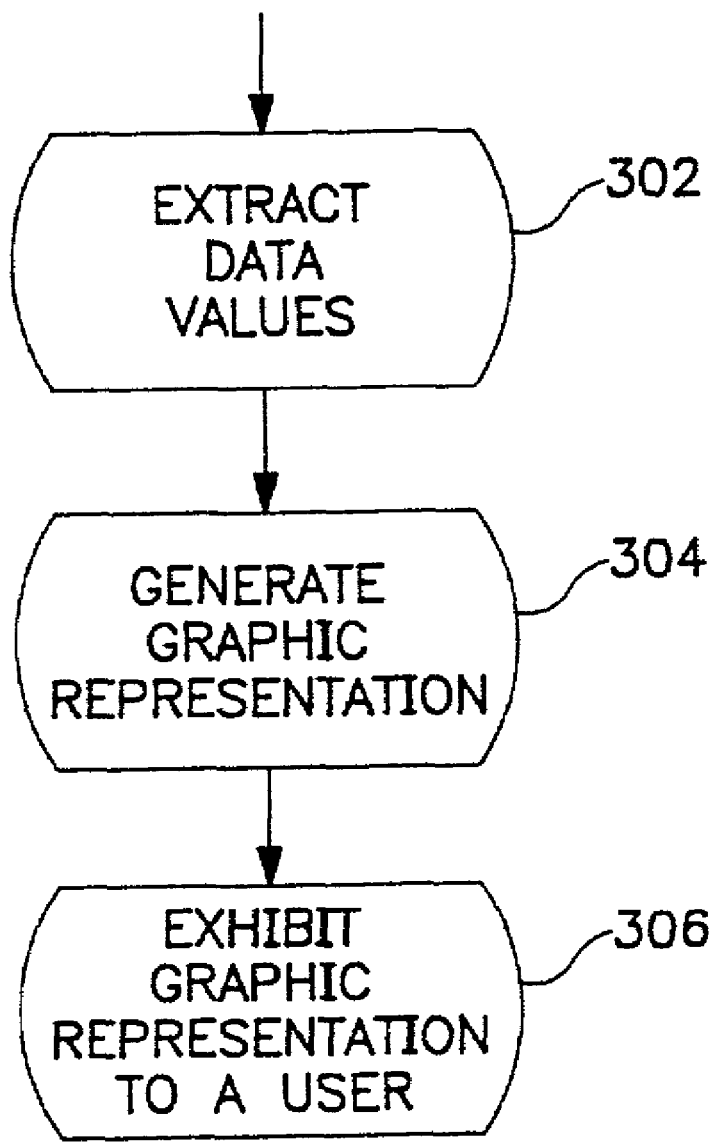
FIG. 3 is a flow chart illustrating steps in a method for visualizing data provided in the form of a geometric representation.

In the foregoing, a method is described for visualizing data arrays provided in the form of data values. The data are associated with geometric shapes placed on a grid. It is also possible, in accordance with another embodiment of the present invention, to visualize data provided in the form of a geometric representation. FIG. 3 is a flow chart illustrating steps in a method for visualizing data provided in the form of a geometric representation. A graphic representation may be coded, for example, in a geometric description language such as GL1, GDS, or the like. In step 302, data values, such as numerical data values, are extracted from a geometric representation. Consider the case in which the geometric representation is an integrated circuit layout. In this case, numerical data values are obtained by extracting power buses and network resistance from the integrated circuit layout. The numerical data values thus obtained may then be organized in a data array such as a matrix.

In step 304, a graphic representation of the data values is generated. Such a graphic representation may be, for example, a graphic representation of a sparse matrix. If the graphic representation is an integrated circuit layout, such a sparse matrix may be a conductance matrix obtained, for example, as part of quiescent drain current analysis. A graphic representation of a sparse matrix may be, for example, a grid corresponding to rows and columns of a matrix in which a colored dot is placed on the grid for each non-zero entry in the matrix.

In step 306, the graphic representation is displayed to a user. A physical design software system such as the Cadence™ system may be used to display a graphic representation, such as a representation of a sparse matrix. A physical design software system may be used to print a colored graphic representation of a sparse matrix.

The use of a physical design software system for the implementation of the present invention is advantageous because such systems can handle large volumes of data. It may in fact be the case that, for some applications, the amount of memory required to store a graphic representation, coded in a geometric description language such as GL1, is larger than the amount of memory required to store the extracted data values.

EXAMPLE

The following example is included to more clearly demonstrate the overall nature of the invention: a method for visualization of numerical matrices. The entries of the matrices may include multi-dimensional, linear, and/or non-linear numerical expressions. This example is exemplary, not restrictive, of the invention.

Matrices are useful constructs both in theoretical and applied mathematical analysis. Specifically, in the field of dynamical systems matrices are useful in the course of both "steady-state" (time independent) and "dynamic" (time dependent) analysis. Both steady-state and dynamic analyses may be performed in relation to dynamic systems arising in the fields of electrical, hydraulic, thermal, and mechanical engineering.

Figure 5:
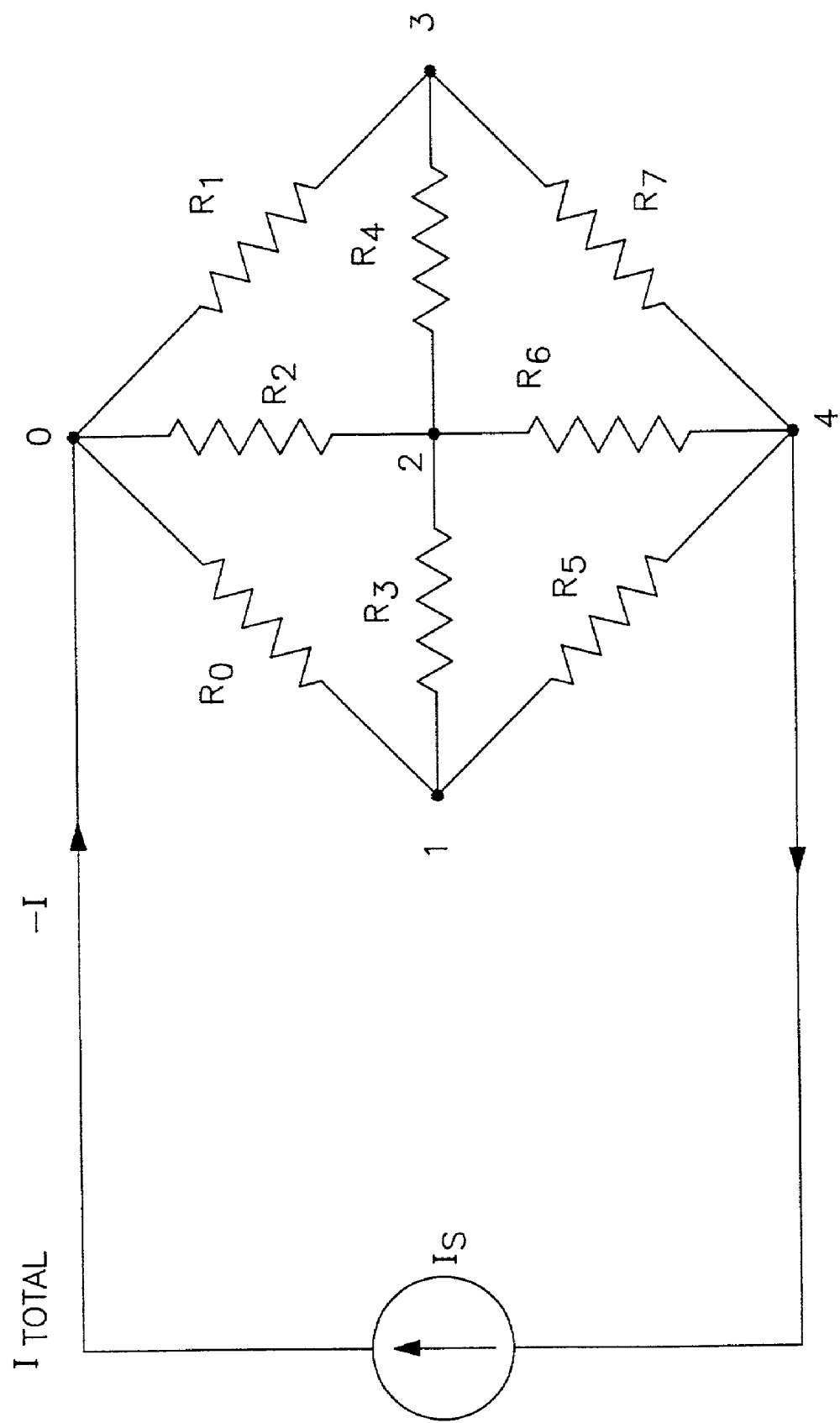
FIG. 5 is an exemplary circuit schematic.

Kirchoff's Current Law (KCL) is a specific example from circuit analysis. KCL is a conservative law which states that the sum of the currents "entering" and "exiting" a node in an electrical network equals zero. A node is defined as the junction of two or more electrical components. FIG. 5 is an exemplary circuit schematic illustrating five such nodes, labeled 0 through 4, connecting between resistors labeled R0, R1, R2, R3, R4, R5, R6, and R7. Table 1 shows a "net list" associated with the circuit of FIG. 5. The "net list" is a tabular representation of the circuit or electrical network of FIG. 5. Table 1 provides all of the information included in the circuit diagram of FIG. 5.

TABLE 1

| "Net List" | | | |
|---|---|---|---|
| MODEL NAME | FROM NODE | TO NODE | VALUE |
| R0 | 0 | 1 | 1 |
| R1 | 0 | 3 | 2 |
| R2 | 0 | 2 | 3 |
| R3 | 1 | 2 | 4 |
| R4 | 3 | 2 | 5 |
| R5 | 1 | 4 | 6 |
| R6 | 2 | 4 | 7 |
| R7 | 3 | 4 | 8 |
| $I_s$ | 0 | 4 | I |

Another equivalent representation of the circuit of FIG. 5 may be obtained by applying KCL. In matrix form the representation of the circuit of FIG. 5 is denoted by the following equation:

$$G*v = \begin{bmatrix} 6 & -1 & -3 & -2 & 0 \\ -1 & 11 & -4 & 0 & -6 \\ -3 & -4 & 19 & -5 & -7 \\ -2 & 0 & -5 & 15 & -8 \\ 0 & -6 & -7 & -8 & 21 \end{bmatrix} * \begin{bmatrix} v_0 \\ v_1 \\ v_2 \\ v_3 \\ v_4 \end{bmatrix} = i = \begin{bmatrix} I_s \\ 0 \\ 0 \\ 0 \\ -I_s \end{bmatrix},$$

where G is a matrix that represents the conductance of resistive components R0 through R7 in the circuit, v is a vector of node voltages, and i is a vector of branch currents. Thus, the dimension, or "size", of G, v, and i each depends on the number of nodes in the circuit. In other words, the greater the number of nodes, the larger the "size" of matrix G and vectors v and i.

Figure 6:
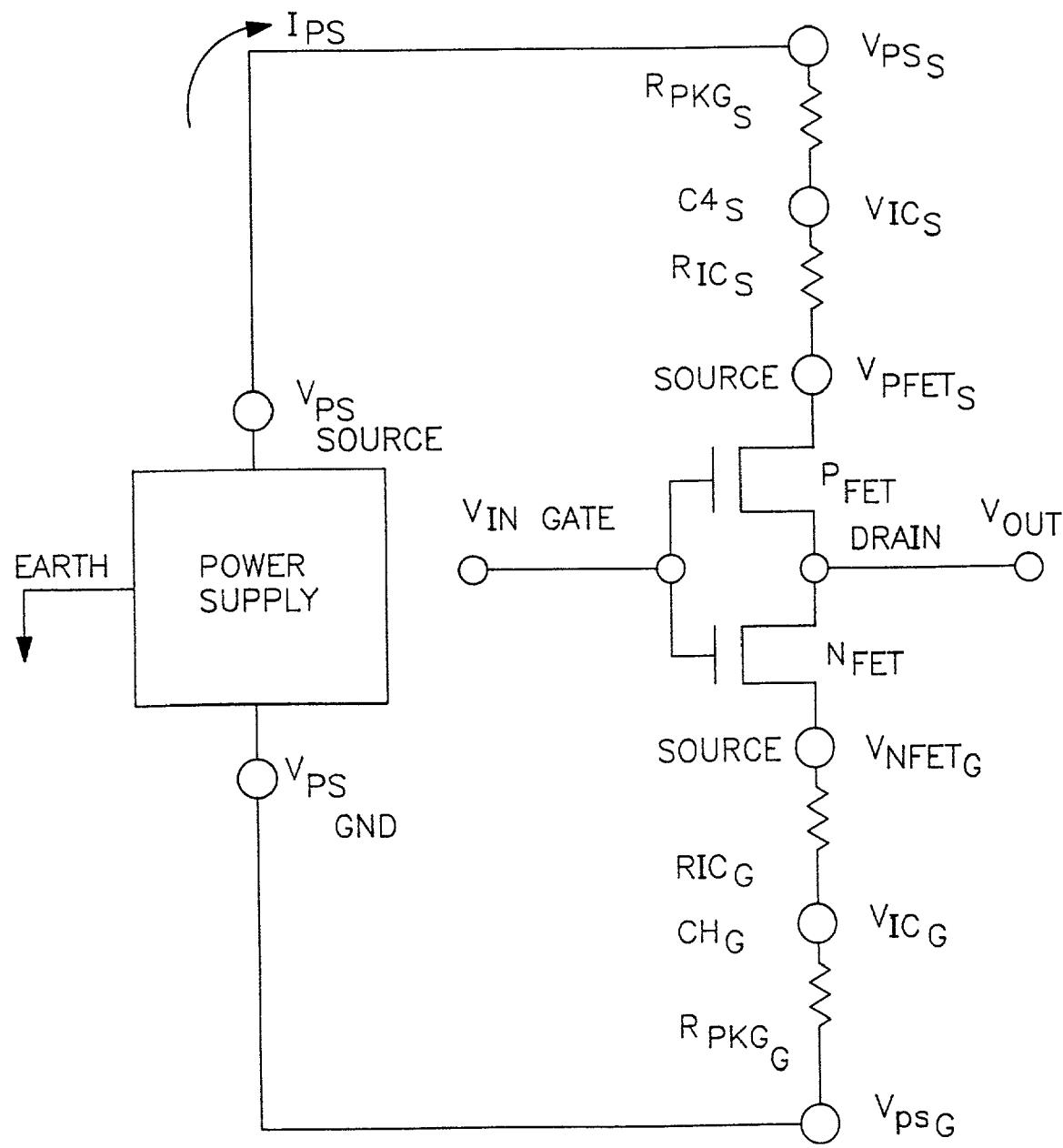
FIG. 6 is a block diagram representation of an exemplary power distribution circuit of an integrated circuit.

A circuit that results in a relatively large conductance matrix G is the power distribution circuit of an integrated circuit (IC). FIG. 6 is a block diagram representation of such a circuit. The circuit of FIG. 6 includes: an external power supply with an "earth" reference, a source voltage, and a ground voltage; a resistor R$_{PKG}$, representing the resistance of the IC package; a resistor R$_{IC}$, representing the resistance of the IC power distribution metalization layers; and IC transistors. FIG. 6 illustrates that the voltage delivered to the IC transistors is "divided" by R$_{PKG}$ and R$_{IC}$, where V$_{ps}$ is lowered by the voltage drop across R$_{PKG_s}$ and R$_{IC_s}$, as given by the equation:

$$V_{PFET_s} = V_{ps_s} - V_{PKG_s} - V_{IC_s},$$

and V$_{ps_G}$ is raised by the voltage drop across R$_{PKGG}$ and R$_{ICG}$, as given by the equation:

$$V_{NFET_G} = V_{ps_G} + V_{PKG_G} + V_{IC_G}.$$

Figure 7:
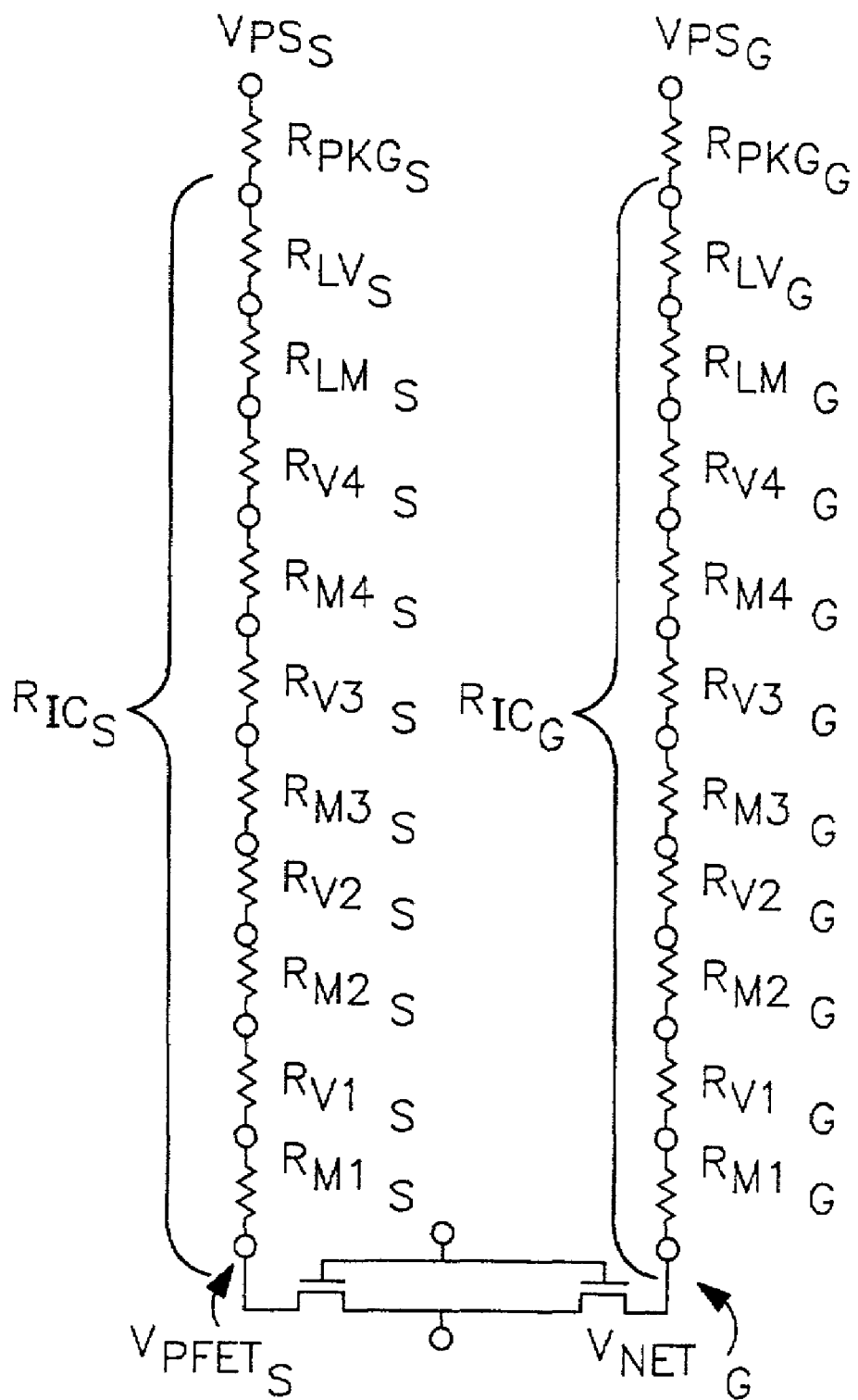
FIG. 7 is a more detailed circuit model for $R_{IC_s}$ and $R_{IC_G}$ of FIG. 6.

FIG. 7 shows a more detailed circuit model for R$_{IC_s}$ and R$_{IC_G}$, where each "level" of IC metalization is modeled as a separate resistor. A contemporary IC may have ten levels to connect V$_{ps_s}$ to V$_{PFET_s}$, and an additional ten levels to connect V$_{NFET_G}$ to V$_{ps_G}$.

Figure 8:
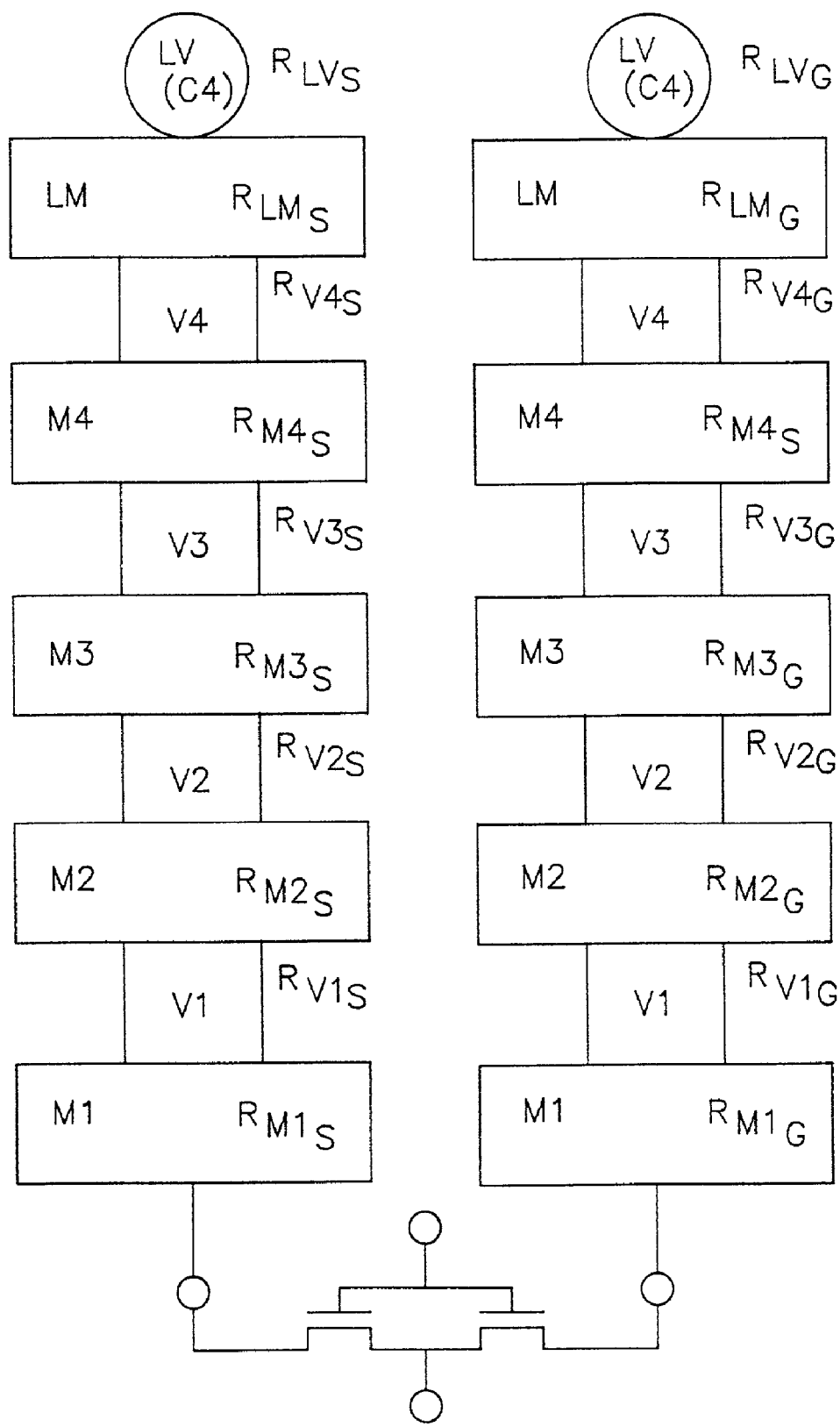
FIG. 8 shows an exemplary physical model for $R_{IC_c}$ and $R_{IC_G}$ of FIG. 7.

FIG. 8 shows the corresponding physical model for R$_{IC_s}$ and R$_{IC_G}$ of FIG. 7, where a metalization level is shown as a rectangle, and an inter-level connection or "via" is represented as a square.

Figure 9:
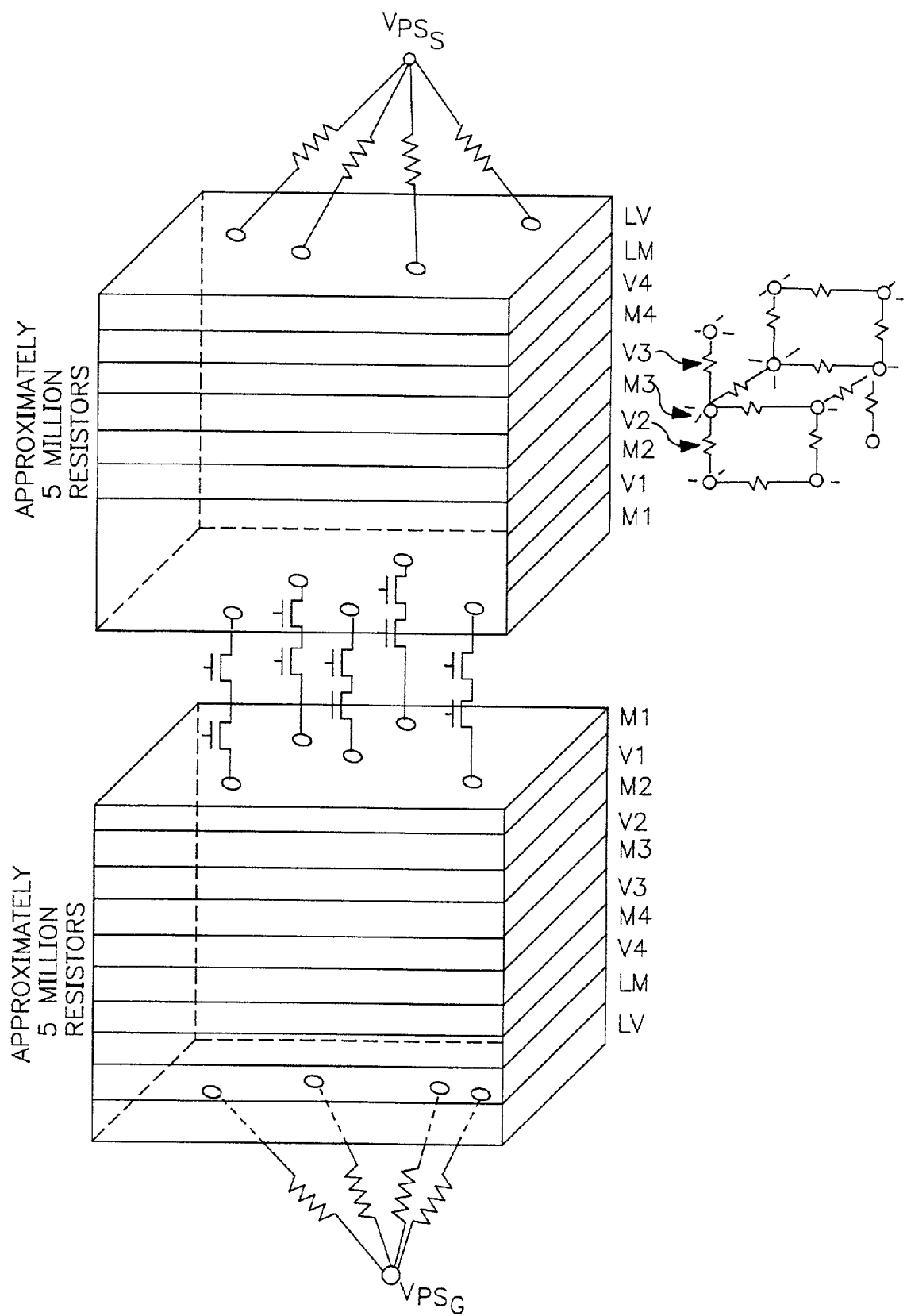
FIG. 9 illustrates metalization levels and inter-level connections of FIG. 8 as sparsely connected resistive grids.

FIG. 9 illustrates the levels and vias of FIG. 8 as sparsely connected resistive grids. A contemporary IC may have approximately five million resistors in each resistive block. Therefore, the resulting conductance matrix G may be of on the order of 3.5 million×3.5 million. Such a matrix is very large.

As applied to this exemplary embodiment, the present invention provides a way to organize the rows and columns of conductance matrix G. Matrix G may be organized so that the entries of matrix G correspond to the physical position of nodes in the circuit. The physical position of nodes in the circuit is shown, for example, in FIG. 9. The following matrix-vector equation G*v=i corresponds to such a reorganization of matrix G for the circuit diagrams of FIGS. 7 and 8.

$$\begin{bmatrix} 1 & -1 & & & & & \\ -1 & 2 & -1 & & & & \\ & -1 & 2 & -1 & & & \\ & & & \ddots & & & \\ & & & & -1 & 2 & -1 \\ & & & & & -1 & 1 \end{bmatrix} * \begin{bmatrix} ^iPKG_s \\ ^iLV_s \\ ^iLM_s \\ ^iV4_s \\ ^iM4_s \\ ^iV3_s \\ ^iM3_s \\ ^iV2_s \\ ^iM2_s \\ ^iV1_s \\ ^iM1_s \\ ^iM1_G \\ ^iV1_G \\ ^iM2_G \\ ^iV2_G \\ ^iM3_G \\ ^iV3_G \\ ^iM4_G \\ ^iV4_G \\ ^iLM_G \\ ^iLV_G \\ ^iPKG_G \end{bmatrix} = \begin{bmatrix} ^vPKG_s \\ ^vLV_s \\ ^vLM_s \\ ^vV4_s \\ ^vM4_s \\ ^vV3_s \\ ^vM3_s \\ ^vV2_s \\ ^vM2_s \\ ^vV1_s \\ ^vM1_s \\ ^vM1_G \\ ^vV1_G \\ ^vM2_G \\ ^vV2_G \\ ^vM3_G \\ ^vV3_G \\ ^vM4_G \\ ^vV4_G \\ ^vLM_G \\ ^vLV_G \\ ^vPKG_G \end{bmatrix}$$

where all zero entries have been left blank, all resistive values have been set to one ohm, and the corresponding resistors are connected serially. Hence, conductance matrix G is organized such that adjacent resistors in the circuit appear as adjacent entries in matrix G.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention. The present invention can further be embodied in the form of computer-implemented processes and apparatus for practicing such processes, for example, and can be embodied in the form of computer program code embodied in tangible media, such as floppy diskettes, fixed (hard) drives, CD ROM's, magnetic tape, fixed/integrated circuit devices, or any other computer-readable storage medium, such that when the computer program code is loaded into and executed by a computer, the computer becomes an apparatus for practicing the invention.

What is claimed:

1. A method for visualizing data arrays provided in the form of a plurality of data values, said method comprising the steps of:

extracting a plurality of data values corresponding to numerical values which identify physical or electrical characteristics of respective electronic equipment in a circuit to generate a grid based on the plurality of data values;

associating each data value of the plurality of data values with one of a plurality of geometric shapes according to a predetermined set of rules;

placing said one of the plurality of geometric shapes associated with each data value of the plurality of data values on the grid; and displaying visual and geometric information placed on the grid to a user in graphical form.

2. The method according to claim 1, wherein the data arrays of the plurality of data values are the data arrays of conductance matrices.

3. A method for visualizing data arrays provided in the form of a plurality of data values, said method comprising the steps of:

extracting a plurality of data values corresponding to numerical values which identify physical or electrical characteristics of respective electronic equipment in a circuit to generate a grid based on the plurality of data values;

identifying one of the plurality of numerical values associated with each data value of the plurality of data values;

associating each numerical value with one of a plurality of visual attributes;

associating each data value of the plurality of data values with one of a plurality of geometric shapes each having one of the plurality of visual attributes, which is consistent with the data value, according to a predetermined set of rules;

placing said one of the plurality of geometric shapes associated with each data value of the plurality of data values on the grid; and displaying visual and geometric information placed on the grid to a user in graphical form.

4. An article of manufacture comprising a computer usable medium having computer readable program code means embodied therein for visualizing data arrays provided in the form of a plurality of data values, the computer readable program code means in said article of manufacture comprising computer readable program code means for causing a computer to effect:

extracting a plurality of data values corresponding to numerical values which identify physical or electrical characteristics of respective electronic equipment in a circuit to generate a grid based on the plurality of data values;

associating each data value of the plurality of data values with one of a plurality of geometric shapes according to a predetermined set of rules;

placing said one of the plurality of geometric shapes associated with each data value of the plurality of data values on the grid; and displaying visual and geometric information placed on the grid to a user in graphical form.

5. The article of manufacture according to claim 4, wherein the data arrays of the plurality of data values are the data arrays of conductance matrices.

6. An article of manufacture comprising a computer usable medium having computer readable program code means embodied therein for visualizing data arrays provided in the form of a plurality of data values, the computer readable program code means in said article of manufacture comprising computer readable program code means for causing a computer to effect:

extracting a plurality of data values corresponding to numerical values which identify physical or electrical characteristics of respective electronic equipment in a circuit to generate a grid based on the plurality of data values;

identifying one of the plurality of numerical values associated with each data value of the plurality of data values;

associating each numerical value with one of a plurality of visual attributes;

associating each data value of the plurality of data values with one of a plurality of geometric shapes each having one of the plurality of visual attributes, which is consistent with the data value, according to a predetermined set of rules;

placing said one of the plurality of geometric shapes associated with each data value of the plurality of data values on the grid; and displaying visual and geometric information placed on the grid to a user in graphical form.

7. A computer program product comprising a computer usable medium having computer readable program code means embodied therein for causing visualization of data arrays provided in the form of a plurality of data values, the computer readable program code means in said computer program product comprising computer readable program code means for causing a computer to effect:

extracting a plurality of data values corresponding to numerical values which identify physical or electrical characteristics of respective electronic equipment in a circuit to generate a grid based on the plurality of data values;

associating each data value of the plurality of data values with one of a plurality of geometric shapes according to a predetermined set of rules;

placing said one of the plurality of geometric shapes associated with each data value of the plurality of data values on the grid; and displaying visual and geometric information placed on the grid to a user in graphical form.

8. The product according to claim 7, wherein the data arrays of the plurality of data values are the data arrays of conductance matrices.

9. A computer program product comprising a computer usable medium having computer readable program code means embodied therein for causing visualization of data arrays provided in the form of a plurality of data values, the computer readable program code means in said computer program product comprising computer readable program code means for causing a computer to effect:

extracting a plurality of data values corresponding to numerical values which identify physical or electrical characteristics of respective electronic equipment in a circuit to generate a grid based on the plurality of data values;

identifying one of the plurality of numerical values associated with each data value of the plurality of data values;

associating each numerical value with one of a plurality of visual attributes;

associating each data value of the plurality of data values with one of a plurality of geometric shapes each having one of the plurality of visual attributes, which is consistent with the data value, according to a predetermined set of rules;

placing said one of the plurality of geometric shapes associated with each data value of the plurality of data values on the grid; and displaying visual and geometric information placed on the grid to a user in graphical form.

10. A storage device readable by machine, tangibly embodying a program of instructions executable by the machine to perform a method for visualizing data arrays provided in the form of a plurality of data values, said method comprising the steps of:

extracting a plurality of data values corresponding to numerical values which identify physical or electrical characteristics of respective electronic equipment in a circuit to generate a grid based on the plurality of data values;

associating each data value of the plurality of data values with one of a plurality of geometric shapes according to a predetermined set of rules;

placing said one of the plurality of geometric shapes associated with each data value of the plurality of data values on the grid; and displaying visual and geometric information placed on the grid to a user in graphical form.

11. The device according to claim 10, wherein the data array of the plurality of data values are the data arrays of conductance matrices.

12. A storage device readable by a machine, tangibly embodying a program of instructions executable by the machine to perform a method for visualizing data arrays provided in the form of a plurality of data values, said method comprising the steps of:

extracting a plurality of data values corresponding to numerical values which identify physical or electrical characteristics of respective electronic equipment in a circuit to generate a grid based on the plurality of data values;

identifying one of the plurality of numerical values associated with each data value of the plurality of data values;

associating each numerical value with one of a plurality of visual attributes;

associating each data value of the plurality of data values with one of a plurality of geometric shapes each having one of the plurality of visual attributes, which is consistent with the data value, according to a predetermined set of rules;

placing said one of the plurality of geometric shapes associated with each data value of the plurality of data values on the grid; and displaying visual and geometric information placed on the grid to a user in graphical form.

* * * * *